United States Patent [19]
Miyazaki et al.

[11] Patent Number: 6,021,149
[45] Date of Patent: Feb. 1, 2000

[54] OPTICAL SEMICONDUCTOR MODULE

[75] Inventors: Yasunori Miyazaki; Toshio Sogo, both of Tokyo, Japan

[73] Assignee: Mitsubishi Denki Kabushiki Kaishi, Tokyo, Japan

[21] Appl. No.: 09/061,346

[22] Filed: Apr. 17, 1998

[30] Foreign Application Priority Data

Nov. 7, 1997 [JP] Japan ................................. 9-305302

[51] Int. Cl.[7] .................................................. H01S 3/19
[52] U.S. Cl. ................... 372/50; 372/46; 372/34; 372/36; 385/88
[58] Field of Search ............................. 372/43–50, 36, 372/34, 38, 26; 385/88, 89, 92

[56] References Cited

U.S. PATENT DOCUMENTS

| | | | |
|---|---|---|---|
| 5,402,436 | 3/1995 | Paoli ........................................... | 372/36 |
| 5,610,930 | 3/1997 | Macomber et al. ....................... | 372/36 |
| 5,621,837 | 4/1997 | Yamada et al. ........................... | 385/88 |
| 5,848,084 | 12/1998 | Rokugawa ................................ | 372/38 |

*Primary Examiner*—Hemang Sanghavi
*Attorney, Agent, or Firm*—Leydig, Voit & Mayer, Ltd

[57] ABSTRACT

An optical semiconductor module includes a substrate including a first plate member having strip lines for high-frequency signal transmission, located on a surface of the substrate and a second plate member including a feeding line on a surface, the first plate member having a loss angle at high frequencies smaller than that of the second plate member, and the second plate member including a material with a higher heat conductivity than that of the first plate member. The optical semiconductor module includes an integrated semiconductor laser and modulator including a modulator region having surface electrodes on a surface, and a laser region having a surface electrode on a surface, with an optical axis extending along the optical axis of the modulator region. The integrated semiconductor laser and modulator are located on the substrate such that the surface electrodes of the modulator region are bonded to the strip lines and the surface electrode of the laser region is bonded to the feeding line.

8 Claims, 11 Drawing Sheets

OPTICAL SEMICONDUCTOR MODULE

FIELD OF THE INVENTION

The present invention relates to an optical semiconductor module and, more particularly, to an optical semiconductor module comprising an ultra high-speed integrated semiconductor laser and modulator for use in large capacity optical fiber communications.

BACKGROUND OF THE INVENTION

FIGS. 5(a)–5(c) are diagrams showing a structure of a prior art optical semiconductor module comprising an integrated semiconductor laser and modulator, wherein FIG. 5(a), FIG. 5(b), and FIG. 5(c) are a perspective view showing a structure of the integrated semiconductor laser and modulator, a perspective view showing a structure of a substrate on which the integrated semiconductor laser and modulator is placed, and a perspective view showing a structure of the optical semiconductor module comprising the integrated semiconductor laser and modulator placed on the substrate, respectively. Referring now to FIG. 5(a), reference numeral 1001 designates integrated semiconductor laser and modulator (laser element). Reference numerals 1020 and 1040 designate a modulator region and a laser region of the laser element 1001, respectively. Reference numerals 1002a and 1002b designate surface electrodes provided in a surface of the modulator region 1020. Reference numerals 1003a and 1003b designate ground electrodes, respectively, which are electrically connected to a rear surface of the modulator region 1020. Reference numerals 1004 and 1005 designate a surface electrode of the laser region 1040 and a ground electrode electrically connected to a rear surface of the laser region 1040, respectively. Referring to FIG. 5(b), reference numerals 1012, 1006, and 1011 designate a substrate, a microstrip line substrate, and a chip carrier, respectively. The substrate 1012 comprises the chip carrier 1011 and the microstrip line substrate 1006 thereon, the chip carrier 1011 comprising CuW or the like and the microstrip line substrate 1006 being a plate member comprising alumina or the like with a small loss angle to high frequency. The chip carrier 1011 functions as a reinforcement for the microstrip line substrate 1006 and a ground conductor of microstrip lines. Reference numerals 1007a, 1007b, 1007d, and 1007e designate gold-plated strip lines, respectively, disposed on the microstrip line substrate 1006. Reference numerals 1007c and 1007f designate a gold-plated feeding line and a gold-plated ground line, respectively, which are disposed on the micro strip line substrate 1006. Reference numeral 1008 designates a terminal resistor of 50Ω provided on the strip line 1007b. Reference numerals 1009b, 1009d, 1009e, and 1009f designate through-holes, respectively, whose inner surfaces are metallized by gold-plating or the like, and through which the strip lines are electrically connected to the chip carrier 1011.

Referring to FIG. 5(c), in the optical semiconductor module, the laser element 1001 is placed on the microstrip line substrate 1006 such that their surfaces face each other, and the surface electrodes 1002a and 1002b, the ground electrodes 1003a and 1003b, the surface electrode 1004, and the ground electrode 1005 are bonded to the strip lines 1007a, 1007b, 1007d, and 1007e, the feeding line 1007c, and the ground line 1007f, respectively.

FIG. 6 is a diagram showing a method of constructing a prior art optical semiconductor module. In the Figure, the same reference numerals as those in FIGS. 5(a)–5(c) designate the same or corresponding parts. First, the method of constructing the prior art optical semiconductor module is described with reference to FIG. 6. The method comprises preparing the integrated semiconductor laser and modulator 1001 (laser element) and the substrate 1012; forming AuSn solder bumps 1010 on respective electrodes in the surface of the laser element 1001; placing the laser element 1001 on the microstrip line substrate 1006 that has been heated to be approximately 340° C. such that their surfaces face each other; attaching the surface electrodes 1002a and 1002b and the ground electrodes 1003a and 1003b of the modulator region 1020, and the surface electrode 1004 and the ground electrode 1005 of the laser region 1040, to the microstrip lines 1007a, 1007b, 1007d and 1007e, the feeding line 1007c, and the ground line 1007f, respectively, by means of the AuSn solder bumps 1010, with pressure, and increasing temperature to bond them together, whereby the optical semiconductor module is completed.

Next, a method of fabricating integrated semiconductor laser and modulator (laser element) for use in the prior art optical semiconductor module and solder bumps on the laser element will be described with reference to FIGS. 4(a)–4(f). FIGS. 4(a)–4(f) are cross-sectional views showing a method of fabricating the laser element and the solder bumps in the prior art, which are perpendicular to the laser resonator length direction. In the Figures, reference numerals 1051, 1052, 1062, 1053, 1054, 1055, 1056, 1057, 1058, 1059, 1060, and 1061 designate an n-type InP substrate, a waveguide layer as an active layer in a laser region, a first p-type InP cladding layer, a high-resistance InP current blocking layer, an n-type InP hole trapping layer, a second p-type InP cladding layer, a p-type InGaAs contact layer, a groove by etching, an $SiO_2$ insulating film, a Cr/Au film, a surface electrode, and a ground electrode electrically connected to the rear surface of the laser element, respectively.

Initially, in the step of FIG. 4(a), on the n-type InP substrate 1051, the waveguide layer 1052 and the first p-type InP cladding layer 1062 are formed by crystal growth, which are etched so as to reach the substrate 1051, to leave a ridge-stripe shaped portion of a prescribed width extending in the laser resonator length direction. Thereafter, the high-resistance InP current blocking layer 1053 and the n-type InP hole trapping layer 1054 are grown to bury the ridge-strip shaped portion, and then the second p-type InP cladding layer 1055 and the p-type InGaAs contact layer 1056 are grown thereon. Note that diffraction gratings generally formed on the waveguide layer 1052 in which the laser region is to be formed are dispensed with herein. In addition, an isolation region to electrically isolate the modulator region from the laser region is also dispensed with herein.

Substantially, in the step of FIG. 4(b), to reduce capacity of the modulator region and, to make electrical connection to the rear surface, etching is performed so as to reach the n-type InP substrate 1051 to form the opening (groove) 1057 in a region comprising no ridge-stripe shaped portion. In the step of FIG. 4(c), after forming the $SiO_2$ insulating film 1058 over the entire surface of the substrate 1051, immediately on the waveguide layer 1052 and in the deepest portion of the groove 1057, there are formed openings in which the contact layer 1056 and the substrate 1051 are exposed at the bottoms thereof, respectively. In the step of FIG. 4(d), the Cr/Au film 1059 is formed over the entire surface of the substrate 1051. In the step of FIG. 4(e), the Cr/Au film 1059 on the waveguide layer 1052 and the groove 1057, is patterned for separation to form the surface electrode 1060 and the electrode 1061, whereby the laser element 1001 is completed.

Thereafter, in the step of FIG. 4(f), after coating the entire surface of the laser element 1001 with a resist, in a portion thereof a window is made using an exposure technique, and then Au-plating and Sn-plating are sequentially performed thereon and the resist is removed, whereby AuSn solder bumps 1010 with melting point 280° C. comprising alloy with the composition ratio of Au to Sn=4:1 is obtained.

In this optical semiconductor module, the chip carrier 1011 is grounded and potentials of the ground electrodes 1003a, 1003b, and 1005 are set to be zero. In this state, DC current is injected into the laser region 1040 through the feeding line 1007c to generate laser beams therein and a modulation signal is applied to the modulator region 1020 through the microstrip line 1007a to modulate the beams, whereby modulated beams are obtained from the facet.

In the prior art optical semiconductor module, a single substrate comprising alumina with a small loss angle to high frequency is employed as the microstrip line substrate 1006 on which the laser element 1001 is placed and the modulator region 1020 and the laser region 1040 are bonded thereto. However, since heat conductivity of alumina is 0.3 W/cm. °C., and thus low, it is difficult to dissipate heat in the vicinity of emission region generated by injecting current into the laser region 1040, resulting in poor heat dissipation, whereby temperature rises significantly therein. As a result, sufficient light output is not obtained with small amount of current during operation at high temperatures.

On the other hand, in the case of employing a sub-mount comprising a material such as SiC with heat conductivity 2.6 W/cm. °C. as the microstrip line substrate, heat conductivity of the material is thus high but loss angle to high frequency is large, whereby superior high-frequency characteristics which reach several tens GHz from DC is not obtained in the modulator region.

As a result, it is extremely difficult to obtain a high-performance optical semiconductor module which has superior high-frequency characteristics and simultaneously can operate at high temperatures.

FIG. 7 is a perspective view showing a structure of another prior art optical semiconductor module. In the Figure, the same reference numerals as those in FIGS. 5(a)–5(c) designate the same or corresponding parts. An array-type laser element comprising integrated semiconductor laser and modulator (array-type laser element) 2001 comprises a plurality of laser elements 1001 in FIGS. 5(a)–5(c) and they are provided such that their optical axes are disposed in parallel with each other. Note that a ground electrode electrically connected to the rear surface is not provided on the front surface of the laser element 1001 and a rear electrode (not shown) is provided on the rear surface thereof. Reference numerals 2002 and 2003 designate a laser region and a modulator region, respectively. Reference numeral 2005 designates a microstrip line substrate of plate member comprising alumina or the like with a small loss angle to high frequency and on the rear surface thereof a ground conductor (not shown) is provided. Reference numeral 2006 designates plural strip lines through which a high-frequency signal is applied, which are disposed on the microstrip line substrate 2005 such that they extend in the direction perpendicular to the optical axis of the array-type laser element 2001, and whose end portions adjacent to the laser element 2001 are respectively aligned in the optical axis direction. Assume that the number of the strip lines 2006 is equal to that of the laser elements 1001. Reference numeral 2007 designates feeding lines aligned spaced apart equally in the direction perpendicular to the optical axis of the laser element 2001 and they are aligned correspondingly to the laser elements 1001. Reference numeral 2010 designates plural strip lines which are disposed on the microstrip line substrate 2005 such that they extend in the direction perpendicular to the optical axis of the array-type laser element 2001, and whose end portions adjacent to the laser element 2001 are respectively aligned in the optical axis direction of the laser element 2001. The plural strip lines 2006 and the plural strip lines 2010 are disposed on opposite end sides of the laser element 2001. Reference numeral 2008 designates terminal resistors each inserted in each of the plural strip lines 2010 and reference numeral 2009 designates through-holes whose inner surfaces are respectively metallized by gold-plating or the like, through which the plural strip lines 2010 are electrically connected to the ground conductor in the rear surface of the microstrip line substrate 2005.

In this optical semiconductor module, the array-type laser element 2001 is placed on the microstrip line substrate 2005 such that a rear surface thereof is bonded opposite to a surface of the microstrip line substrate 2005. The microstrip lines 2006 are each connected to each surface electrode 1002b of the modulator region 2003, and the microstrip lines 2010 are each connected to each surface electrode 1002a of the modulator region 2003, by means of the bonding wires 2004 such as gold lines or the like. The ground electrodes electrically connected to the rear surface of the laser element 2001 are bonded to ground metal films or the like provided on the microstrip line substrate 2005 where the laser element 2001 is to be placed, and then grounded.

In this optical semiconductor module, the chip carrier 1011 is grounded and a potential of a rear electrode (not shown) of the laser element 2001 is set to be zero. In this state, DC current is injected into the laser region 2002 through the feeding line 2007 to generate laser beams therein and a modulation signal is applied to the modulator region 2003 through the microstrip line 2006 to modulate the laser beams, whereby modulated beams are obtained from the facet.

However, in this optical semiconductor module, with an increase in the number of laser elements 1001 of the array-type laser element 2001, the bonding wires 2004 for connecting the surface electrodes 1002b and 1002a to the microstrip lines 2006 and 2010, respectively, become longer. Accordingly, cross-talk due to transconductance between wirings and self-inductance causes the modulated beams to be distorted. As a result, a high-performance optical semiconductor module with superior high-frequency characteristics is not obtained.

To avoid the problem, it is possible that the strip lines 2006 and 2010 are disposed in the vicinity of the facet from which the laser beams are emitted, i.e., in the vicinity of the modulator region 2003. In this case, however, the bonding wires 2004 prevents the beams from being emitted.

It is also possible that the strip lines 2006 and 2010 are disposed in the vicinity of the facet of the laser region 2002. However, since an output light intensity monitor or a photodiode for controlling an output light is generally provided in the vicinity of the facet of the laser region 2002, it is impossible to dispose the strip lines and provide the boding wires therein.

As described above, in the prior art, a high-performance optical semiconductor module is not obtained.

SUMMARY OF THE INVENTION

It is an object of the present invention to provide a high-performance optical semiconductor module.

Other objects and advantages of the present invention will become apparent from the detailed description given hereinafter. It should be understood, however, that the detailed description and specific embodiment are given by way of illustration only, since various changes and modifications within the scope of the invention will become apparent to those skilled in the art from this detailed description.

According to a first aspect of the present invention, an optical semiconductor module comprises; a substrate including a first plate member which is provided with strip lines for a high-frequency signal on a surface thereof, and a second plate member provided together with the first plate member, which is provided with a feeding line on a surface thereof, the first plate member comprising a material with a loss angle to high frequency which is smaller than that of the second plate member, and the second plate member comprising the material with heat conductivity which is higher than that of the first plate member; and integrated semiconductor laser and modulator including a modulator region having surface electrodes on a surface thereof, and a laser region having a surface electrode on a surface thereof, whose optical axis extends on the same line as an optical axis of the modulator region, the integrated semiconductor laser and modulator being placed on the substrate such that the surface electrodes of the modulator region are bonded to the strip lines and the surface electrode of the laser region is bonded to the feeding line. Therefore, in the modulator region, the first plate member reduces loss to high-frequency to improve high-frequency characteristics, while in the laser region, the second plate member effectively dissipates heat generated by injecting current. As a result, a high-performance optical semiconductor module with superior high-frequency characteristics and heat dissipation, which can operate at high temperatures, is realized.

According to a second aspect of the present invention, in the optical semiconductor module of the first aspect, a ground conductor is provided on a rear surface of the substrate and the strip lines serve as micro strip lines. Therefore, a high-performance optical semiconductor module with superior high-frequency characteristics and heat dissipation, which can operate at high temperatures, is realized.

According to a third aspect of the present invention, in the optical semiconductor module of the second aspect, ground lines are provided on the surface of the first plate member and connected to the ground conductor in the rear surface thereof through through-holes, respectively, ground electrodes are provided on the surface of the modulator region of the integrated semiconductor laser and modulator and electrically connected to the rear surface thereof, and the ground lines are each bonded to each of the ground electrodes.

Therefore, a high-performance optical semiconductor module with superior high-frequency characteristics and heat dissipation, which can operate at high temperatures, is realized.

According to a fourth aspect of the present invention, an optical semiconductor module comprises; integrated semiconductor laser and modulator including a modulator region having surface electrodes on a surface thereof, and a laser region having a surface electrode on a surface thereof, whose optical axis extends on the same line as an optical axis of the modulator region; a first plate member comprising strip lines extending in stripe in a surface thereof, the strip lines being bonded to the surface electrodes of the modulator region, respectively such that the strip lines extend in the direction perpendicular to the optical axis direction of the integrated semiconductor laser and modulator; and a second plate member placed on a rear surface of the integrated semiconductor laser and modulator, the first plate member comprising a material with a loss angle to high frequency which is smaller than that of the second plate member, and the second plate member comprising the material with heat conductivity which is higher than that of the first plate member.

Since the entire rear surface of the integrated semiconductor laser and modulator is in contact with the second plate member with high heat conductivity, an optical semiconductor module which can operate at high temperatures is realized with heat dissipation improved. In addition, since the first plate member serving as the substrate for the strip lines through which a high-frequency signal is transmitted, comprises a material with a small loss angle to high frequency, a high-performance optical semiconductor module with superior high-frequency characteristics and heat dissipation, which can operate at high temperatures, is realized.

According to a fifth aspect of the present invention, in the optical semiconductor module of the fourth aspect, the strip lines and ground lines disposed in parallel at opposite sides thereof constitute a coplanar line, ground electrodes are provided on the surface of the modulator region and electrically connected to the rear surface thereof, and the ground lines are each bonded to each of the electrodes.

Therefore, a high-performance optical semiconductor module with superior high-frequency characteristics and heat dissipation, which can operate at high temperatures, is realized.

According to a sixth aspect of the present invention, an optical semiconductor module comprises a substrate; and array-type integrated semiconductor laser and modulator comprising a plurality of semiconductor lasers and modulators which are integrated and placed on the substrate, which respectively include a modulator region having surface electrodes on a surface thereof, and a laser region having a surface electrode on a surface thereof, whose optical axis extends on the same line as an optical axis of the modulator region, wherein distances between facets thereof from which laser beams are emitted and the modulator regions differ from each other, and surfaces thereof are coplanar with each other and the facets thereof are coplanar with each other, and the substrate is provided with plural linear strip lines whose end portions are connected to the surface electrodes of the modulator regions, respectively, and which respectively extend in the direction perpendicular to an optical axis direction of the integrated semiconductor laser and modulator, and feeding lines connected to surface electrodes of the laser regions, respectively.

Since the surface electrodes of the modulator regions are directly connected to the strip lines, respectively, so that bonding wires or the like for connection are dispensed with. Therefore, although in the prior art semiconductor laser element, the bonding wires become longer with an increase in the number of laser elements in array, whereby crosstalk due to self-inductance and transconductance between wires causes modulated beams to be distorted, this problem is avoided herein.

As a result, a high-performance optical semiconductor module with superior high-frequency characteristics is realized.

According to a seventh aspect of the present invention, in the optical semiconductor module of the six aspect, a ground conductor is provided on the rear surface of the substrate and the strip lines serve as microstrip lines.

Therefore, a high-performance optical semiconductor module with superior high-frequency characteristics is realized.

According to an eighth aspect of the present invention, in the optical semiconductor module of the seventh aspect, the substrate is provided with plural ground lines on a surface thereof, which are connected to the ground conductor on the rear surface thereof through through-holes, respectively, and which are paired with the plural strip lines, respectively, ground electrodes are provided on the surface of the modulator region of each of the semiconductor lasers and modulators, and electrically connected to the rear surface thereof, and the ground electrodes are each bonded to each of the ground lines.

Therefore, a high-performance optical semiconductor module with superior high-frequency characteristics is realized.

BRIEF DESCRIPTION OF THE DRAWINGS

FIGS. 9(a) and 9(b) are diagrams showing an optical semiconductor module according to a third embodiment of the present invention, wherein FIG. 9(a) is a perspective view showing a structure of array-type integrated semiconductor laser and modulator, and FIG. 9(b) is a perspective view showing a structure of a substrate on which the array-type integrated semiconductor laser and modulator is placed.

DETAILED DESCRIPTION OF PREFERRED EMBODIMENTS

Embodiment 1

In an optical semiconductor module of the present invention, integrated semiconductor laser and modulator (laser element) is placed on a substrate, and a material of the substrate where a modulator region is placed differs from that of the substrate where a laser region is placed. Specifically, loss angle to high-frequency of the former is smaller than that of the latter, and the latter has heat conductivity which is higher than that of the former.

Figure 1:
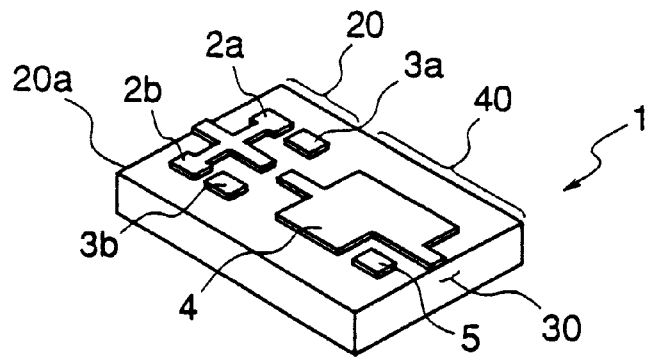
FIGS. 1(a)–1(c) are perspective views showing an optical semiconductor module according to a first embodiment of the present invention.
Figure 1:
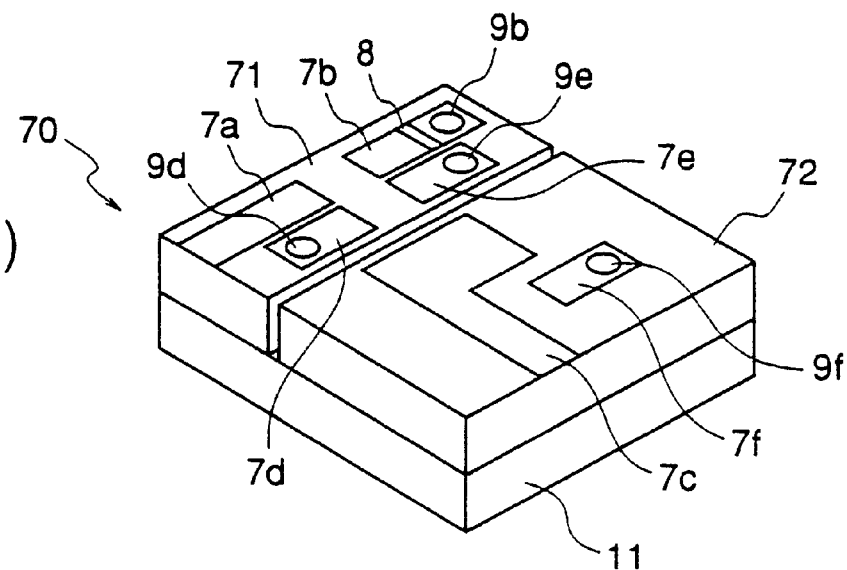
Figure 1:
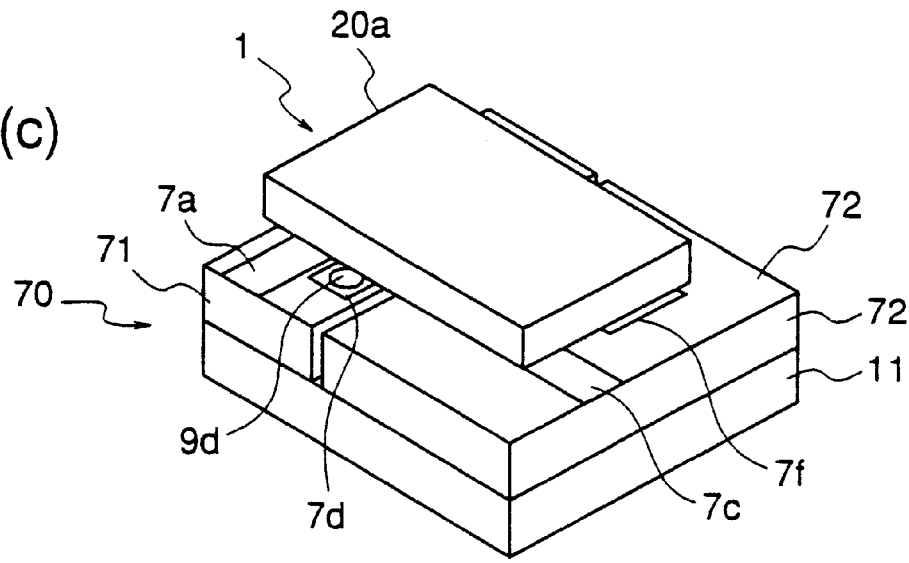

FIGS. 1(a)–1(c) are diagrams showing an optical semiconductor module according to a first embodiment of the present invention, wherein FIGS. 1(a), 1(b), and 1(c) are a perspective view showing a structure of integrated semiconductor laser and modulator (laser element) as a part of the optical semiconductor module, a perspective view showing a structure of a substrate on which the laser element is placed, and a perspective view showing the optical semiconductor module comprising the laser element on the substrate.

As shown in FIG. 1(a), a laser element 1 comprises a modulator region 20 having surface electrodes 2a and 2b on a surface thereof, and a laser region 40 having a surface electrode 4 in a surface thereof, whose optical axis extends on the same line as an optical axis of the modulator region 20. An optical waveguide path 30 extends in the optical axis direction and a facet 20a from which beams are emitted is disposed perpendicularly to the direction in which the optical waveguide path 30 extends. Ground electrodes 3a and 3b are disposed at opposite sides of the optical axis and are respectively electrically connected to the rear surface of the laser element 1. Although only one of the ground electrodes 3a and 3b may be provided, it is preferable in terms of operating characteristics that they are provided at opposite sides of the optical axis. A ground electrode 5 is electrically connected to the rear surface of laser element 1.

As shown in FIG. 1(b), a substrate 70 comprises a chip carrier 11 comprising CuW or the like, a first plate member 71 which serves as a microstrip line substrate comprising alumina (Al$_2$O$_3$), AlN or the like with a small loss angle to high frequency, and a second plate member 72 which serves as a sub-mount comprising SiC or the like with heat conductivity which is higher than that of the first plate member 71, the first and second plate members 71 and 72 being provided on the chip carrier 11. It should be noted that other materials may be employed for the first plate member 71 so long as a loss angle to high frequency is smaller than that of the second plate member 72, and the same goes for the second plate member 72 so long as they have heat conductivity which is higher than that of the first plate member 71. The chip carrier 11 securely holds the plate members 71 and 72 and serves as a reinforcement and a ground conductor of them. The thicknesses of the plate members 71 and 72 are respectively adjusted with the same height so that a step which troubles packaging of the laser element 1 does not occur. Although the plate members 71 and 72 are separated spatially from each other, they may be bonded to each other. In this case, there may be provided a plated ground conductor in rear surfaces of the plate members 71 and 72 without proving the chip carrier 11. Gold-plated strip lines 7a, 7b, 7d, and 7e disposed on the first plate member 71, and the chip carrier 11 serving as the ground conductor provided on the rear surface of the first plate member 71 correspond to microstrip lines. A terminal resistor 8 of 50Ω is inserted in the strip line 7b. A gold-plated feeding line 7c and a gold-plated ground line 7f are respectively disposed on the second plate member 72. Through-holes 9b, 9d, 9e, and 9f are provided in the strip lines 7b, 7d, 7e, and 7f, respectively, whose inner surfaces are respectively metallized by gold plating or the like, and through which the strip lines 7b, 7d, 7e, and 7f are electrically connected to the chip carrier 11 as the ground conductor.

As shown in FIG. 1(c), in this optical semiconductor module, the laser element 1 is placed on the first and second plate members 71 and 72 such that a surface thereof faces surfaces of the plate members 71 and 72, the optical axis of which extends in the direction of array of the plate members 71 and 72, and the modulator and laser regions 20 and 40 of which are placed on the first and second plate members 71 and 72, respectively. The surface electrodes 2a and 2b, the ground electrodes 3a and 3b, the surface electrode 4, and the ground electrode 5 are bonded to the strip lines 7a, 7b, 7d, and 7e, the feeding line 7c, and the ground line 7f, respectively.

In this state, the surface electrode 2a is connected to the strip line 7a. The surface electrode 2b is connected to the chip carrier 11 through the strip line 7b and the through hole 9b. The ground electrode 3a is connected to the chip carrier 11 through the strip line 7d and the through hole 9d. The ground electrode 3b is connected to the chip carrier 11 through the strip line 7e and the through hole 9e. The terminal resistor 8 is inserted in the strip line 7b, and therefore it is connected to the modulator region 20 in parallel.

Figure 8:
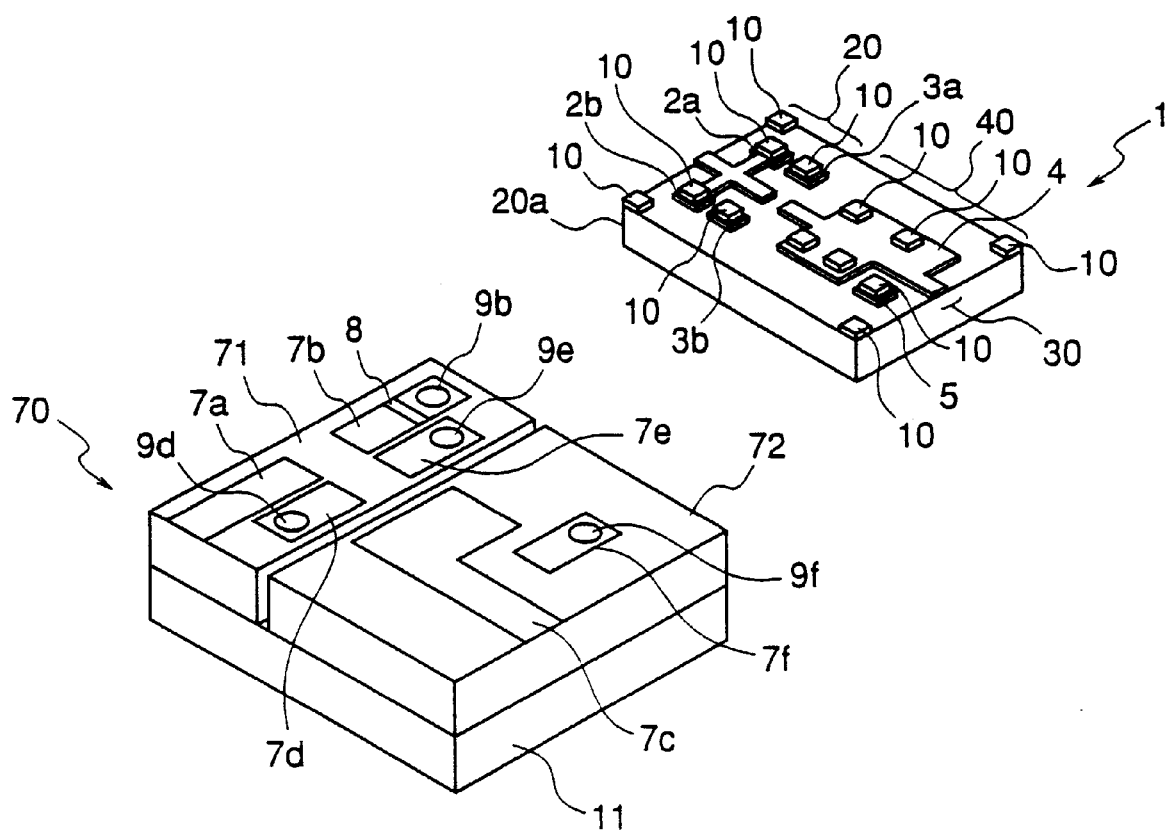
FIG. 8 is a perspective view showing a method of constructing an optical semiconductor module according to a first embodiment of the present invention.

FIG. 8 is a diagram showing a method of constructing the optical semiconductor module of the first embodiment. In the Figure, the same reference numerals as those in FIGS. 1(a)–1(c) designate the same or corresponding parts. First, a method of constructing the optical semiconductor module of this embodiment is described. The method comprises preparing the laser element 1 and the substrate 70, providing AuSn solder bumps 10 in respective prescribed positions on the surface thereof, placing the laser element 1 on the substrate 70 which has been heated to approximately 340° C. such that the surface thereof faces the surface of the substrate 70, attaching the surface electrodes 2a and 2b, the ground electrodes 3a and 3b of the modulator region 20, and the surface electrode 4 and the electrode 5 of the laser region 40, to the strip lines 7a, 7b, 7d, and 7e, the feeding line 7c, and the ground line 7f, respectively, with pressure, by means of the solder bumps 10, and increasing temperature to bond them together, whereby the optical semiconductor module is completed.

Next, an operation of the optical semiconductor module is described. The chip carrier 11 is grounded and potentials of the ground electrodes 3a, 3b and 5 are set to be zero. In this state, DC current is injected into the laser region 40 through the feeding line 7c to generate laser beams therein and a modulation signal is applied to the modulator region 20 through the strip line 7d to modulate the laser beams, whereby modulated beams are obtained from a facet 20a in the modulator region 20.

In this optical semiconductor module, the modulator region 20 is placed on the first plate member 71 of the substrate 70 comprising alumina or the like with a small loss angle to high frequency, and the laser region 40 is placed on the second plate member 72 of the substrate 70 comprising SiC or the like with high heat conductivity. Therefore, in the modulator region 20, the first plate member 71 reduces high-frequency loss to improve high-frequency characteristics, while in the laser region 40, the second plate member 72 effectively dissipates heat generated by injecting current. As a result, it is possible to provide a high-performance optical semiconductor module with superior high-frequency characteristics and heat dissipation, which can operate at high temperatures.

Figure 2:
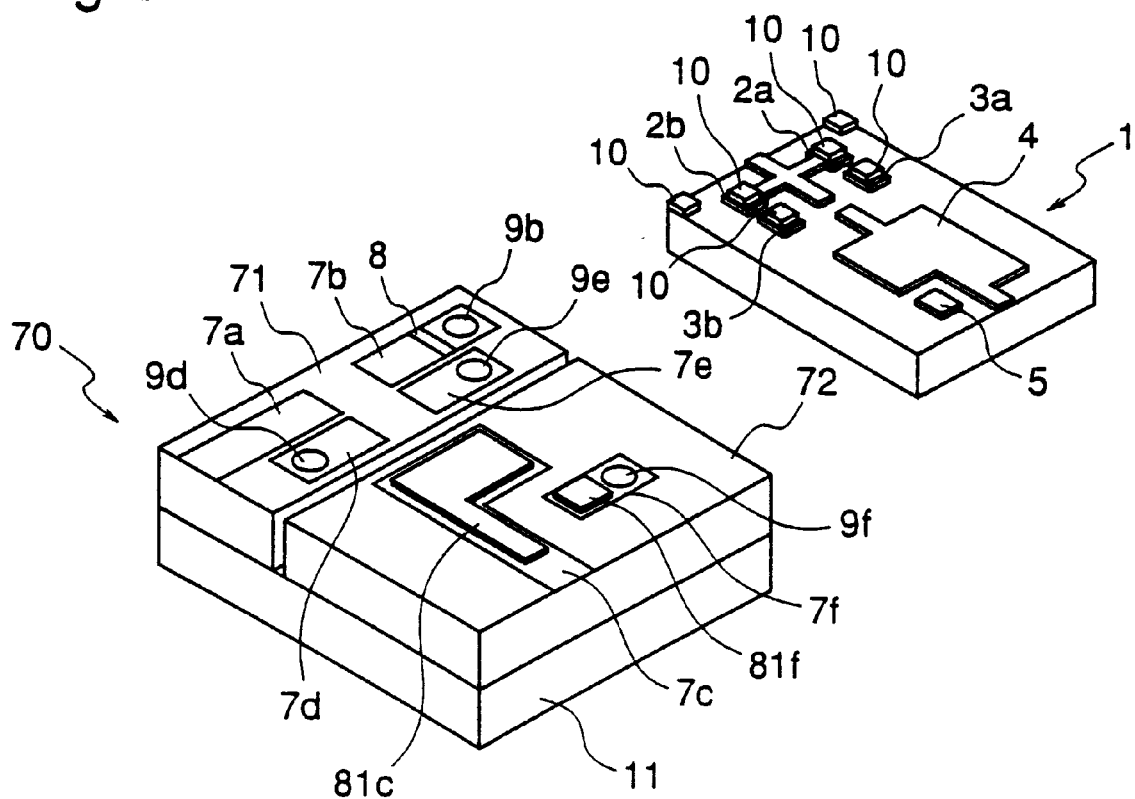
FIG. 2 is a perspective view showing a method of constructing a modification of the optical semiconductor module according to the first embodiment of the present invention.

Although in this embodiment the surface electrode 4 and the ground electrode 5 are bonded to the feeding line 7c and the ground line 7f, respectively, by means of solder bumps 10 in constructing the optical semiconductor module, AuSn solders 81c and 81f may be thinly patterned in portions to which the surface electrode 4 and the ground electrode 5 are bonded, respectively, as shown in FIG. 2, without proving the solder bumps therein, whereby the surface electrode 4 and the ground electrode 5 may be bonded to the feeding line 7c and the ground line 7f, respectively. Also in this case, the same effects as provided in the first embodiment are obtained.

In addition, although each strip line serves as a micro strip line in this embodiment, ground lines may be provided at opposite sides of each strip line so as to serve as a coplanar line. Also in this case, the same effects as provided in the first embodiment are obtained.

Embodiment 2

Figure 3:
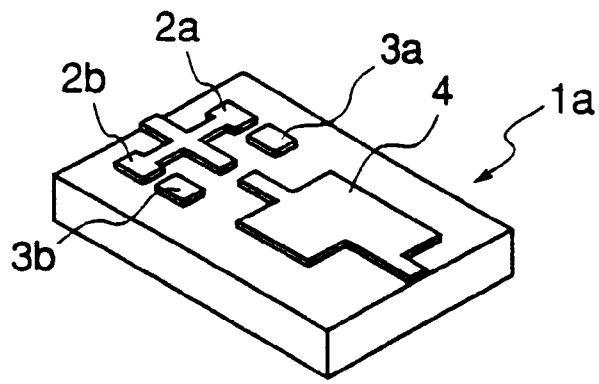
FIGS. 3(a)–3(c) are perspective views showing an optical semiconductor module according to a second embodiment of the present invention.
Figure 3:
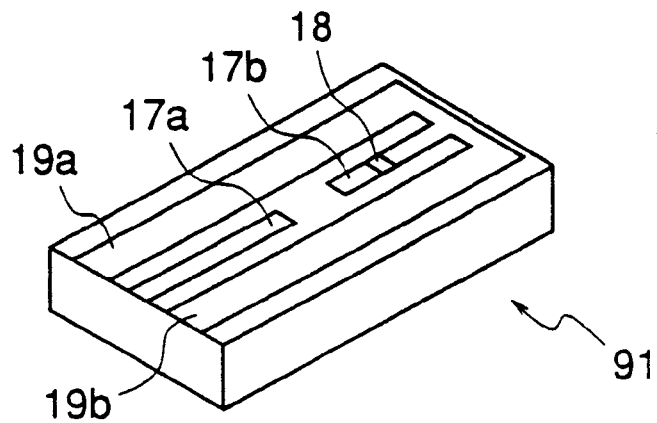
Figure 3:
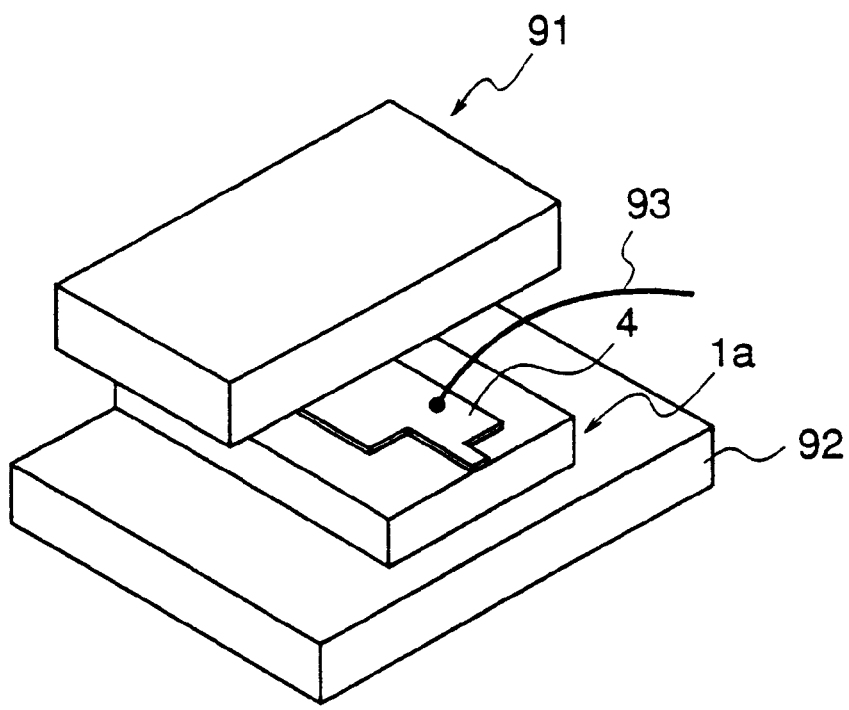
Figure 4:
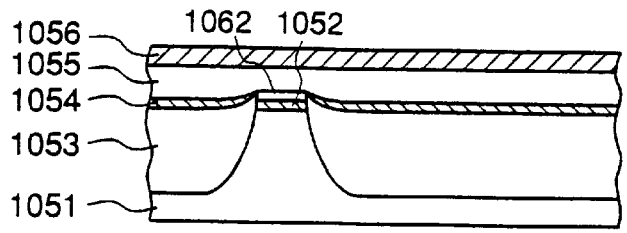
FIGS. 4(a)–4(f) are cross-sectional views showing a method of fabricating integrated semiconductor laser element and modulator for use in the prior art optical semiconductor module.
Figure 4:
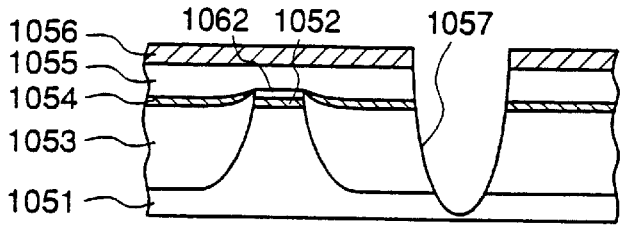
Figure 4:
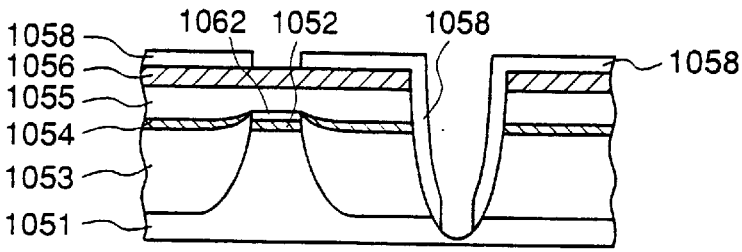
Figure 4:
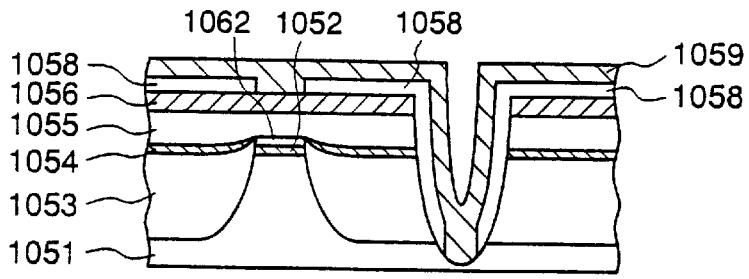
Figure 4:
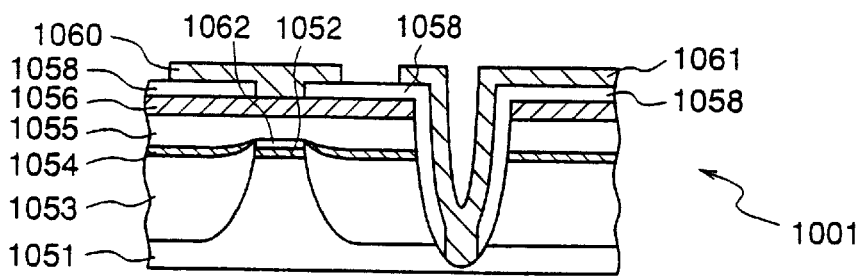
Figure 4:
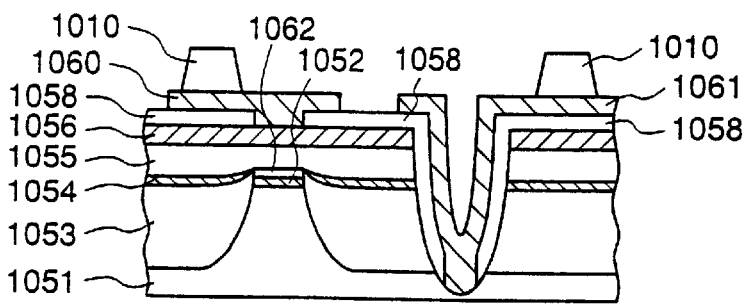
Figure 5:
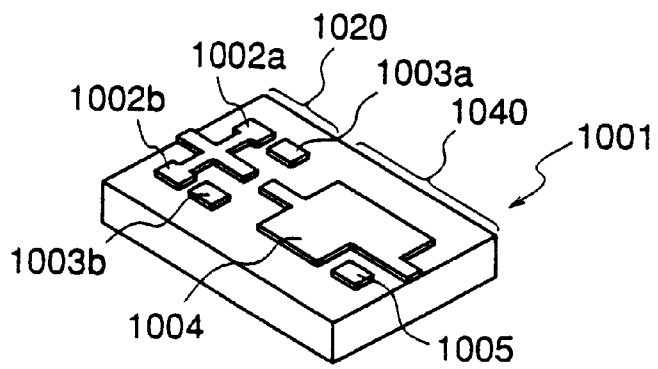
FIGS. 5(a)–5(c) are perspective views showing a prior art optical semiconductor module.
Figure 5:
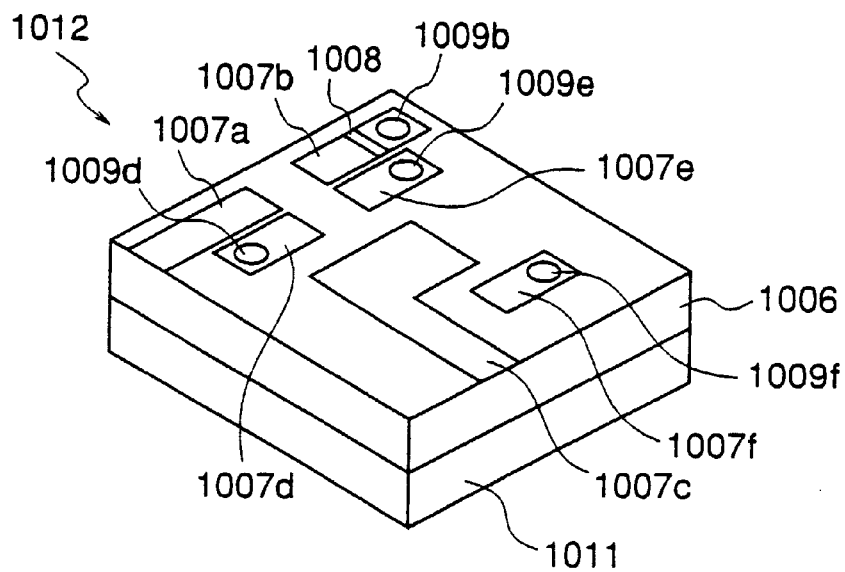
Figure 5:
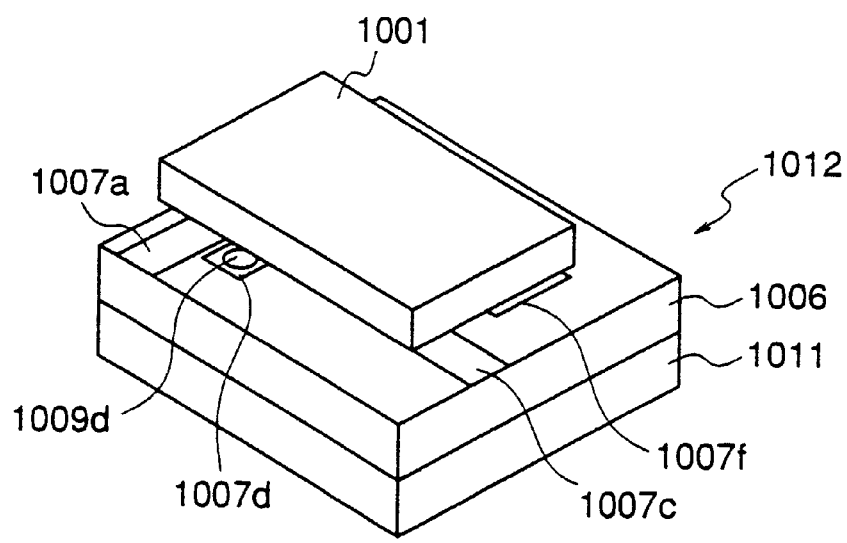
Figure 6:
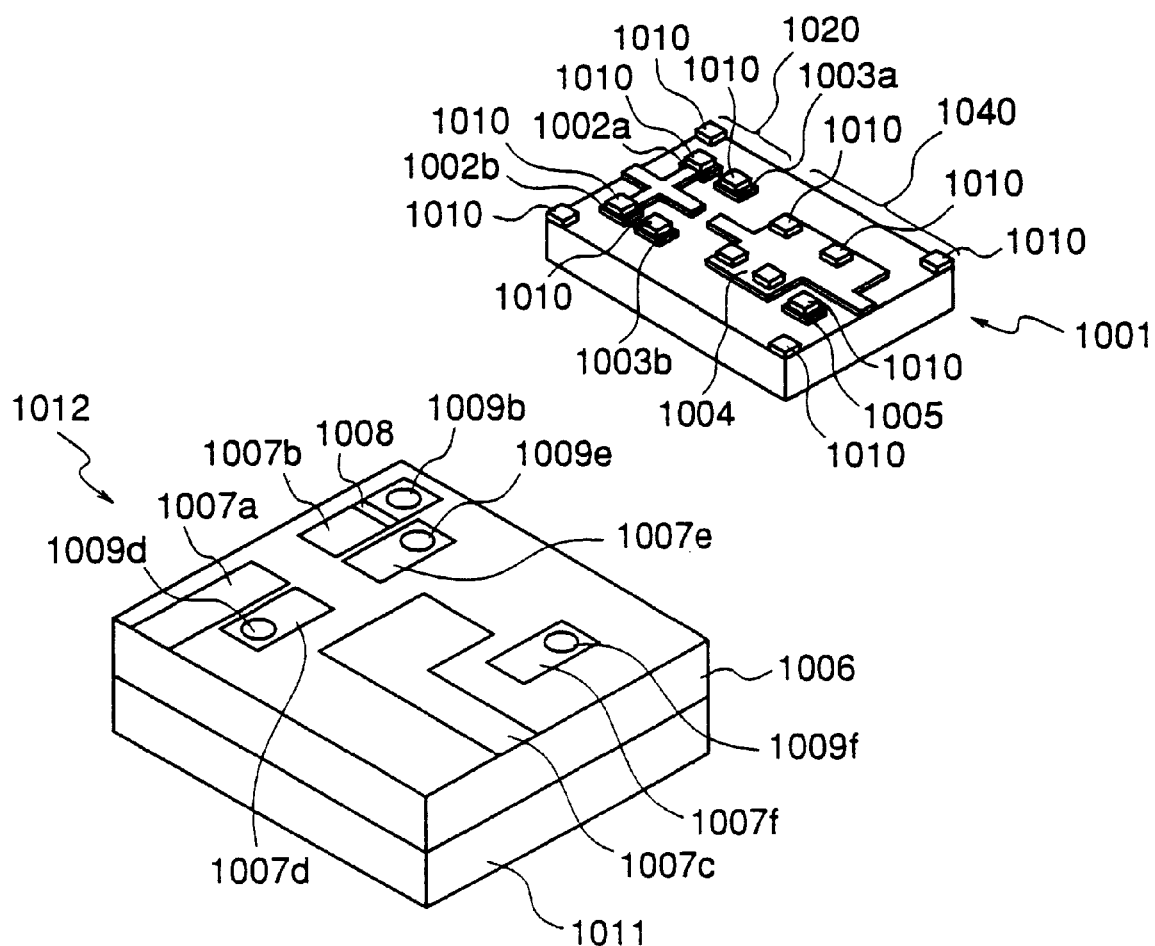
FIG. 6 is a perspective view showing a method of constructing a prior art optical semiconductor module.
Figure 7:
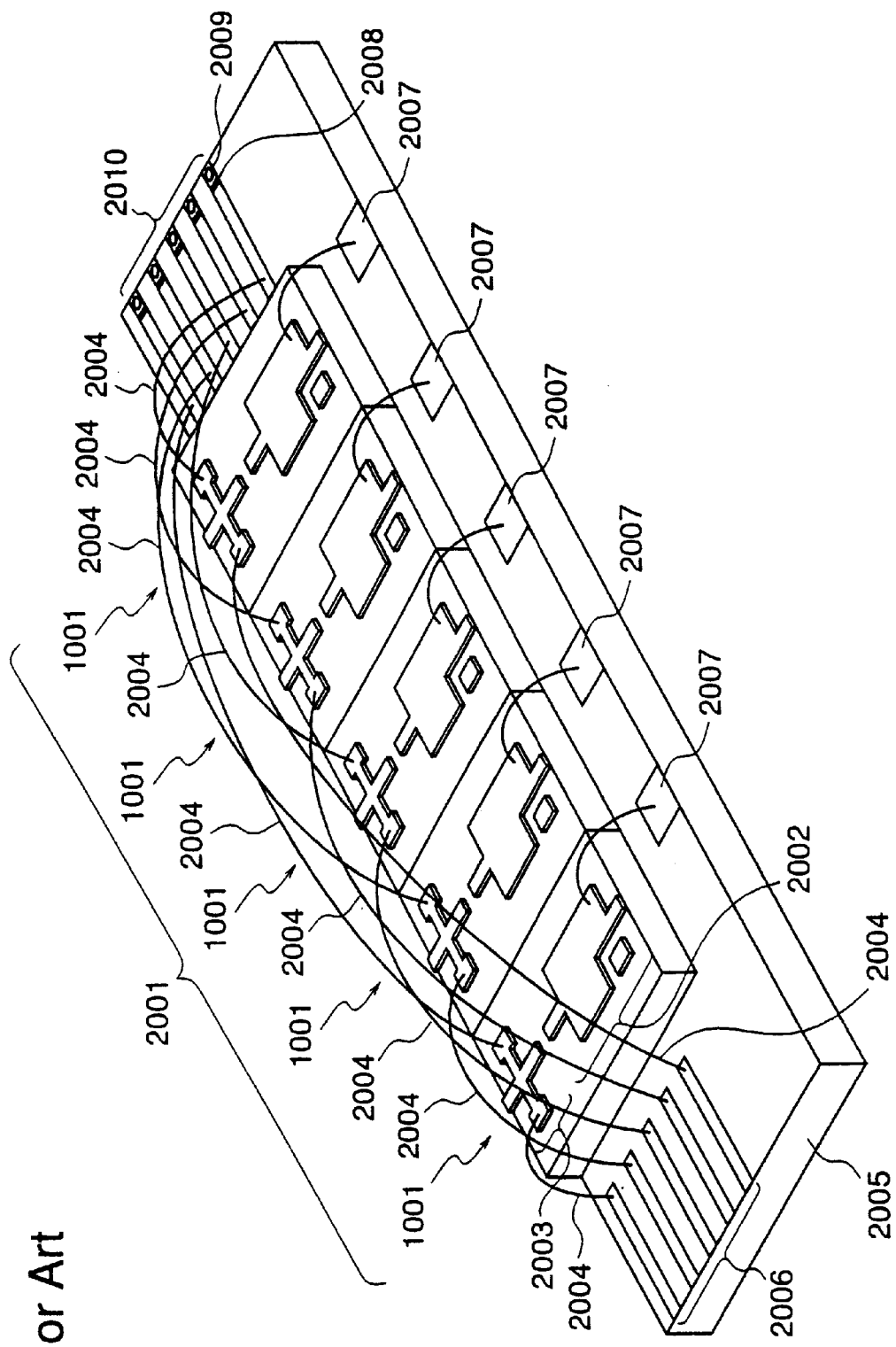
FIG. 7 is a perspective view showing another prior art optical semiconductor module.

FIGS. 3(a)–3(c) are diagrams showing an optical semiconductor module according to a second embodiment of the present invention, wherein FIGS. 3(a), 3(b), and 3(c) show a structure of integrated semiconductor laser and modulator (laser element), a structure of a first plate member which serves as a substrate for a coplanar line, which is placed on the laser element 1, and a structure of the optical semiconductor module. In the Figures, the same reference numerals as those in FIGS. 1(a)–1(c) designate the same or corresponding parts. First, the structure of the optical semiconductor module is described with reference to these Figures. Referring to FIG. 3(a), in integrated semiconductor laser and modulator (laser element) 1a, the laser element 1 in FIG. 1(a) is provided with a rear electrode (not shown) on the rear surface thereof without providing the ground electrode 5 on the surface thereof. Referring to FIG. 3(b), on a surface of a first plate member 91 serving as a coplanar line substrate comprising alumina or the like with a small loss angle to high frequency, there are provided strip lines 17a and 17b extending on the same line and spaced apart by a prescribed distance from each other, and ground lines 19a and 19b disposed in parallel at opposite sides of them. The strip lines 17a and 17b, and the ground lines 19a and 19b constitute the coplanar line. The strip line 17b comprises an inserted terminal resistor 18 of 50Ω and its end portion which is not opposite an end portion (toward the center) of the strip line 17a is connected to the ground lines 19a and 19b. A second plate member 92 serves as a sub-mount on which the laser element 1a is placed and comprises SiC or the like which has high heat conductivity. A bonding wire 93 is used for connecting the surface electrode 4 of the laser region to an external feeding source of the optical semiconductor module. An upper surface, a bottom surface, and at least one of side surfaces of the second plate member 92 are metallized by gold-plating or the like.

Referring to FIG. 3(c), in this optical semiconductor module, the laser element 1a is placed on the second plate member 92 such that a rear surface thereof is in contact with a surface of the second plate member 92, by means of solders or the like, and the first plate member 91 is placed on the modulator region 20 of the laser element 1(a) such that a surface thereof faces a surface of the laser element 1a. The surface electrode 2a of the modulator region 20 is bonded to the end portion (toward the center) of the strip line 17a, which is opposite an end portion (toward the center) of the strip line 17b, by means of AuSn solder. The surface electrode 2b of the modulator region 20 is bonded to the end portion of the strip line 17b by means of AuSn solder. The ground electrodes 3a and 3b of the modulator region 20 are bonded to the ground line 19b by means of AuSn solder. In this state, the surface electrode 2b is connected to the end portion of the strip line 17b and the ground electrode 3b is connected to the ground line 19b, and therefore the terminal resistor 18 is connected to the modulator region 20 in parallel.

Next, operation of the optical semiconductor module is described. When the rear surface of the second plate member 92 is grounded, the rear electrode of the laser region 40 is grounded. In this state, DC current is injected into the surface electrode 4 of the laser region 40 through the bonding wire 93. The ground lines 19a and 19b are grounded, and a modulation signal is applied to the modulator region 20 through the strip line 17a, whereby modulated beams are obtained from the facet 20a of the modulator region 20.

In this optical semiconductor module, since the entire rear surface of the laser element 1a is in contact with the second plate member 92 with high heat conductivity, an optical semiconductor module which can operate at high temperatures is obtained with heat dissipation improved. In addition, since the first plate member 91 serving as the substrate of the strip lines 17a and 17b (coplanar line) through which a high-frequency signal is transmitted, comprises a material with a small loss angle to high frequency, an optical semiconductor module with superior high-frequency characteristics is obtained.

Embodiment 3

Figure 9:
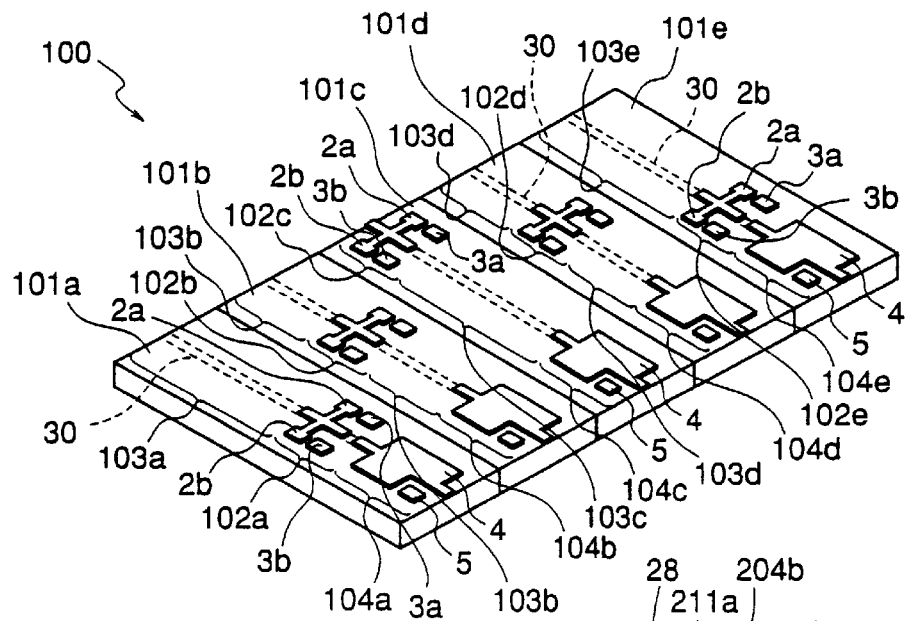
Figure 9:
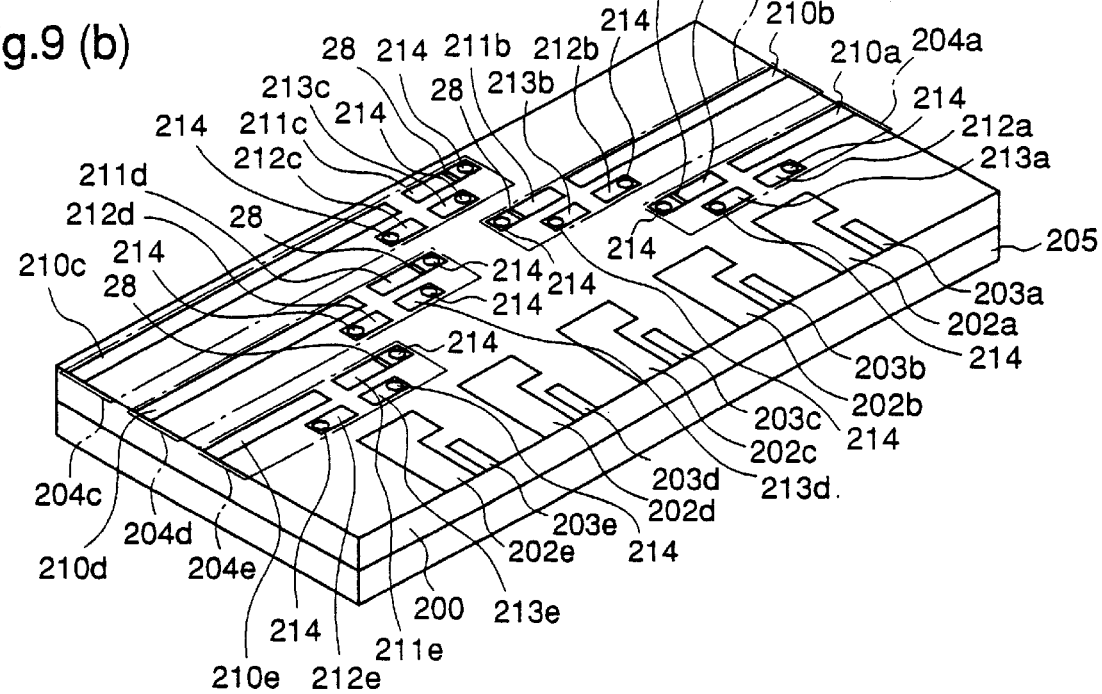

FIGS. 9(a) and 9(b) are diagrams showing a structure of an optical semiconductor module according to a third embodiment of the present invention, wherein FIG. 9(a) is a perspective view showing a structure of array-type integrated semiconductor laser and modulator (array-type laser element), and FIG. 9(b) is a perspective view showing a structure of a substrate on which the array-type laser element is placed.

In the Figures, the same reference numerals as those in FIGS. 1(a)–1(c) designate the same or corresponding parts. Referring to FIG. 9(a), an array-type laser element 100 comprises a plurality of laser elements 101a to 101e each having the same structure as the laser element 1 in FIGS. 1(a)–1(c) such that their respective optical axes are in parallel with each other. In the laser elements 101a to 1010e, respective facets thereof from which beams are emitted, are coplanar with each other and so are upper surfaces thereof. Although five laser elements are provided herein, any number will do so long as it is two or more. The laser elements 101a to 101e are provided with waveguide paths 103a to 103e in which beam loss is little, respectively, and which are respectively provided between the modulator and laser regions, or between the modulator region and the corresponding facet, as required. Positions of respective modulator regions 102a to 102e in the optical axis direction are adjusted so that 3 or more of them are not aligned perpendicularly to the optical axis of the array-type laser element 100. The distance between the modulator region 102c and the corresponding facet of the laser element 101c in the center of the laser elements 101a to 101e is the shortest, and distances between the modulator region 102a and the corresponding facet, and between the modulator region 102e and the corresponding facet, of the outermost laser elements 101a and 101e are the longest.

Referring to FIG. 9(b), a substrate 200 comprises alumina or the like and on the surface thereof, there are provided 5 strip line groups 204a to 204e which respectively extend toward the center from the ends of the substrate 200 in parallel with each other, and whose end portions toward the center of the substrate 200 are disposed so as to conform to positions of the modulator regions 102a to 102e, respectively.

The substrate 200 is provided with a chip carrier 205 on a rear surface thereof, thereby 5 strip line groups 204a to 204e serve as micro strip line groups. Note that the rear surface of the substrate 200 may be metallized without providing the chip carrier 205 thereon. The strip line groups 204a to 204e comprises strip lines 210a, 211a, 212a, and 213a, strip lines 210b, 211b, 212b, and 213b, strip lines 210c, 211c, 212c, and 213c, strip lines 210d, 211d, 212d, and 213d, and strip lines 210e, 211e, 212e, and 213e respectively. The strip lines 210a to 210e through which a high-frequency signal is applied, respectively, extend toward the center from ends of the substrate 200 in parallel with each other. The strip lines 211a to 211e are disposed spaced apart by a prescribed distance from end portions extending toward the center of the substrate 200 of the strip lines 210a to 210e, respectively. The strip lines 212a to 212e are disposed in the vicinity of the end portions of the strip lines 210a to 210e, respectively and the strip lines 213a to 213e are disposed in the vicinity of end portions of the strip lines 211a to 211e, which are opposite the end portions of the strip lines 210a to 210e, respectively.

The strip lines 211a to 211e, the strip lines 212a to 212e, and the strip lines 213a to 213e are respectively provided with through holes 214 whose inner surfaces are metallized, and which are electrically connected to the chip carrier 205. Through the end portions of the strip lines 210a to 210e toward the center of the substrate 200, in the vicinity of regions in the direction perpendicular to the extending direction of these strip lines 210a to 210e, there are provided 5 feeding lines 202a to 202e which are paired with the strip line groups 204a to 204e, respectively. The feeding lines 202a to 202e are aligned in the direction parallel to the extending direction of the strip lines 210a to 210e. In the vicinity of the feeding lines 201a to 202e, there are provided ground lines 203a to 203e, respectively.

Figure 10:
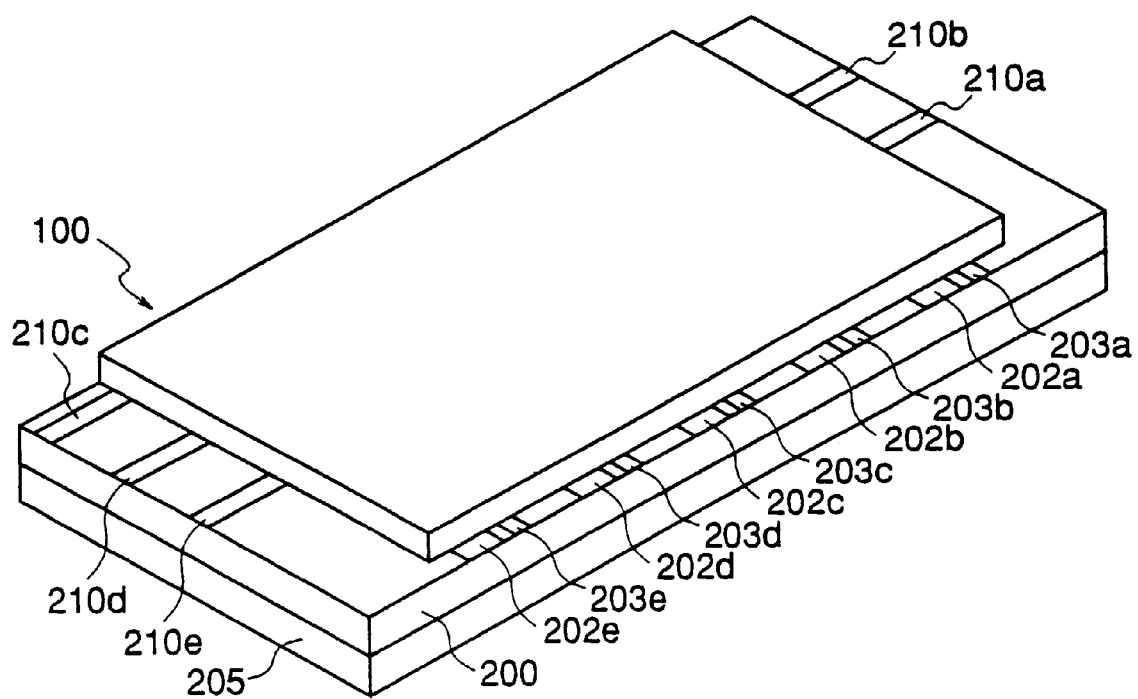
FIG. 10 is a perspective view showing a structure of the optical semiconductor module according to the third embodiment of the present invention.

FIG. 10 is a perspective view showing a structure of the optical semiconductor module in which the laser element 100 is placed on the substrate 200. Referring to FIG. 10, the array-type laser element 100 is placed on the substrate 200 in such a way that a surface thereof faces the surface of the substrate 200 so that its optical axis is perpendicular to the extending direction of the strip line groups 204a to 204e. The surface electrodes 2a and 2b of modulator regions 102a to 102e, and the surface electrodes 4 of laser regions 104a to 104e are bonded to the end portions of the strip lines 210a to 210e, and end portions of the strip lines 211a to 211e which are opposite the end portions of the strip lines 210a to 210e, and the feeding lines 202a to 202e, respectively, by means of solder or the like. The ground electrodes 3a, ground electrodes 3b and ground electrodes 5 of the laser elements 101a to 101e are bonded to the strip lines 212a to 212e, the strip lines 213a to 213e, and the ground lines 203a to 203e, respectively, by means of solder or the like. Since there are variations of positions in the optical axis direction of the modulator regions 102a to 102e, the strip lines 210a to 210e extending in the direction perpendicular to the optical axis direction are only connected to the modulator regions 102a to 102e to which their end portions are connected.

In this optical semiconductor module, the surface electrodes 2a of the modulator regions 102a to 102e are connected to the strip lines 210a to 210e, respectively. The surface electrodes 2b of the modulator regions 102a to 102e are connected to the chip carrier 205 through the strip lines 211a to 211e and the through holes 214, respectively. The ground electrodes 3a of the modulator regions 102a to 102e are connected to the chip carrier 205 through the strip lines 212a to 212e and the through holes 214, respectively. The ground electrodes 3b of the modulator regions 102a to 102e are connected to the chip carrier 205 through the strip lines 213a to 213e and the through holes 214, respectively. Terminal resistors 28 are inserted in the strip lines 211a to 211e respectively, and therefore they are connected to the modulator regions 102a to 102e in parallel, respectively.

The chip carrier 205 is grounded and potentials of the ground electrodes 3a, 3b, and 5 are set to be zero. In this state, DC current is injected into the laser regions 104a to 104e through the feeding lines 202a to 202e, respectively, to generate laser beams therein and modulation signals are applied to the modulator regions 102a to 102e through the microstrip lines 210a to 210e, respectively, to modulate the laser beams, whereby modulated beams are obtained from the facet.

In this third embodiment, the surface electrodes 2a of the modulator regions 102a to 102e are directly connected to the strip lines 210a to 210e, i.e., the microstrip lines, so that bonding wires or the like for connection are dispensed with. Therefore, although in the prior art semiconductor laser element, the bonding wires become longer with an increase in the number of laser elements in array, whereby crosstalk due to self-inductance and transconductance between wires causes modulated beams to be distorted, this problem is avoided herein. As a result, a high-performance optical semiconductor module with superior high-frequency characteristics is obtained with laser elements in array increased without degrading high-frequency characteristics.

Figure 11:
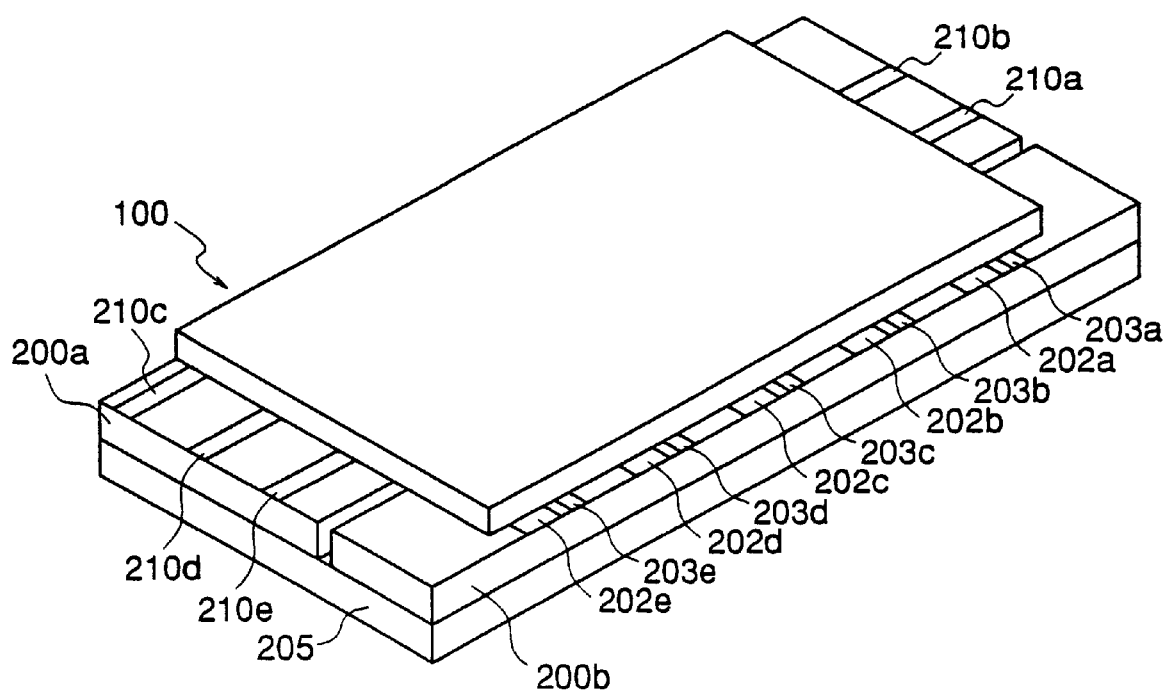
FIG. 11 is a perspective view showing an optical semiconductor module according to a modification of the third embodiment of the present invention.

FIG. 11 is a diagram showing a modification of the optical semiconductor module according to the third embodiment of the present invention. In the Figure, the same reference numerals as those in FIGS. 9(a) and 9(b) designate the same or corresponding parts. In addition, reference numerals 200a and 200b designate a first plate member comprising a material such as alumina with a small loss angle to high frequency and a second plate member comprising a material such as SiC with high heat conductivity, respectively.

Although in the third embodiment the single substrate 200 comprising alumina or the like is employed, in this modification, the substrate 200 on which an array-type laser element 100 is placed comprises first and second plate members 200a and 200b as shown in FIG. 11. As described in the first embodiment, the material of the substrate where the modulator regions 102a to 102e are placed, differs from the material of the substrate where the laser regions 104a to 104e are placed. Specifically, loss angle to high frequency of the former is smaller than that of the latter, and the latter has heat conductivity which is higher than that of the former. Also in this modification, the same effects as provided in the third embodiment are obtained and simultaneously an optical semiconductor module which can operate at high temperatures is obtained with heat dissipation from the laser regions 104a to 104e improved.

Although in the third embodiment strip lines serve as microstrip lines, ground lines may be provided at opposite sides of the strip line so as to serve as a coplanar line. Also in this case, the same effects as provided in the third embodiment are obtained.

What is claimed is:

1. An optical semiconductor module comprising:
a substrate including a first plate member including strip lines, for transmitting a high-frequency signal, on a surface of the first plate member, and a second plate member provided together with the first plate member, the second plate member including a feeding line on a surface of the second plate member, the first plate member comprising a material having a loss angle at high frequency smaller than that of the second plate member, and the second plate member comprising a material having a higher heat conductivity than the first plate member; and
an integrated semiconductor laser and modulator including a modulator region having surface electrodes, and a laser region having a surface electrode, and an optical axis extending along the optical axis of the modulator region, the integrated semiconductor laser and modulator being located on the substrate such that the surface electrodes of the modulator region are bonded to the strip lines and the surface electrode of the laser region is bonded to the feeding line.

2. The optical semiconductor module of claim 1 including a ground conductor located on a rear surface of the substrate, the strip lines serving as micro strip lines.

3. The optical semiconductor module of claim 2 wherein:
ground lines are located on the surface of the first plate member and connected to the ground conductor on the rear surface of the first plate member through through-holes, respectively,
ground electrodes are located on the surface of the modulator region of the integrated semiconductor laser and modulator and are electrically connected to the rear surface, and
the ground lines are each bonded to a respective ground electrode.

4. An optical semiconductor module comprising:
an integrated semiconductor laser and modulator including a modulator region having surface electrodes on a surface of the modulator region, and a laser region having a surface electrode on a surface of the laser region, the laser region having an optical axis extending along an optical axis of the modulator region,
a first plate member comprising strip lines extending in a stripe on a surface of the first plate member, the strip lines being bonded to the surface electrodes of the modulator region, respectively, such that the strip lines extend in a direction perpendicular to the optical axis of the integrated semiconductor laser and modulator; and
a second plate member located on a rear surface of the integrated semiconductor laser and modulator, the first plate member comprising a material having a loss angle at high frequency smaller than that of the second plate member, and the second plate member comprising the material having a higher heat conductivity than the first plate member.

5. The optical semiconductor module of claim 4 wherein:
the strip lines and ground lines are parallel and the ground lines are located at opposite sides of the strip lines, constituting a coplanar line,
ground electrodes are located on the surface of the modulator region and electrically connected to the rear surface, and
the ground lines are each bonded to a respective electrode.

6. An optical semiconductor module comprising:
a substrate; and
an integrated semiconductor laser and modulator array comprising a plurality of semiconductor lasers and modulators integrated and located on the substrate, each semiconductor laser and modulator including a modulator region having surface electrodes on a surface of the modulator region, and a laser region having a surface electrode on a surface of the laser region, an optical axis of the laser extending on an optical axis of the modulator region, wherein distances between facets of the lasers from which laser beams are emitted and the modulator regions differ from each other in the array, surfaces of the modulators and the lasers are coplanar with each other, and the facets of the modulator and the laser are coplanar with each other, the substrate including plural linear strip lines having end portions connected to the surface electrodes of respective modulator regions, and which respectively extend in a direction perpendicular to an optical axis of an integrated semiconductor laser and modulator, and feeding lines connected to surface electrodes of the laser regions, respectively.

7. The optical semiconductor module of claim 6 including a ground conductor located on the rear surface of the substrate, the strip lines serving as micro strip lines.

8. The optical semiconductor module of claim 7 wherein:

the substrate includes plural ground lines on a surface of the substrate, the ground lines are connected to the ground conductor on the rear surface through through-holes, respectively, and the ground lines are paired with the plural strip lines, respectively, ground electrodes are located on the surface of the modulator region of each of the semiconductor lasers and modulators, and electrically connected to their rear surfaces, and the ground electrodes are each bonded to a respective ground line.

* * * * *